United States Patent
Topacio et al.

(10) Patent No.: US 8,294,266 B2
(45) Date of Patent: Oct. 23, 2012

(54) CONDUCTOR BUMP METHOD AND APPARATUS

(75) Inventors: Roden R. Topacio, Markham (CA); Neil McLellan, Austin, TX (US); Yip Seng Low, Thornhill (CA); Andrew K W Leung, Markham (CA)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 13/027,076

(22) Filed: Feb. 14, 2011

(65) Prior Publication Data

US 2011/0133338 A1 Jun. 9, 2011

Related U.S. Application Data

(62) Division of application No. 11/832,486, filed on Aug. 1, 2007, now Pat. No. 7,906,424.

(51) Int. Cl.
*H01L 23/48* (2006.01)
*H01L 23/52* (2006.01)

(52) U.S. Cl. ........ 257/737; 257/778; 257/773; 257/786; 257/E23.069

(58) Field of Classification Search .................. 257/737, 257/778, E23.069, 773, 786
See application file for complete search history.

(56) References Cited

U.S. PATENT DOCUMENTS

| | | |
|---|---|---|
| 3,593,319 A | 7/1971 | Barber |
| 4,249,196 A | 2/1981 | Durney et al. |
| 4,409,608 A | 10/1983 | Yoder |
| 4,434,452 A | 2/1984 | Hamabe et al. |
| 4,470,098 A | 9/1984 | Alexander |
| 4,685,197 A | 8/1987 | Tigelaar et al. |
| 4,797,789 A | 1/1989 | Naitoh et al. |
| 4,866,567 A | 9/1989 | Crafts et al. |
| 4,868,613 A | 9/1989 | Hirachi |
| 4,901,128 A | 2/1990 | Sunami et al. |
| 4,914,546 A | 4/1990 | Alter |
| 4,937,649 A | 6/1990 | Shiba et al. |
| 5,053,916 A | 10/1991 | Weekamp et al. |
| 5,081,559 A | 1/1992 | Fazan et al. |
| 5,089,878 A | 2/1992 | Lee |
| 5,155,658 A | 10/1992 | Inam et al. |
| 5,162,258 A | 11/1992 | Lemnios et al. |
| 5,189,594 A | 2/1993 | Hoshiba |

(Continued)

FOREIGN PATENT DOCUMENTS

DE 2548563 5/1977

(Continued)

OTHER PUBLICATIONS

PCT/CA2009/001039 International Search Report mailed Oct. 16, 2009.

(Continued)

*Primary Examiner* — Nitin Parekh
(74) *Attorney, Agent, or Firm* — Timothy M. Honeycutt

(57) ABSTRACT

Various semiconductor die conductor structures and methods of fabricating the same are provided. In one aspect, a method of manufacturing is provided that includes forming a conductor structure on a conductor pad of a semiconductor die. The conductor layer has a surface. A polymeric layer is formed on the surface of the conductor layer while a portion of the surface is left exposed. A solder structure is formed on the exposed portion of the surface and a portion of the polymeric layer.

15 Claims, 9 Drawing Sheets

U.S. PATENT DOCUMENTS

| | | | |
|---|---|---|---|
| 5,208,725 | A | 5/1993 | Akcasu |
| 5,656,863 | A | 8/1997 | Yasunaga et al. |
| 5,668,399 | A | 9/1997 | Cronin et al. |
| 5,907,785 | A | 5/1999 | Palagonia |
| 6,266,227 | B1 | 7/2001 | Konushi et al. |
| 6,384,343 | B1 | 5/2002 | Furusawa |
| 6,387,795 | B1* | 5/2002 | Shao ............................ 438/613 |
| 6,433,427 | B1* | 8/2002 | Wu et al. ........................ 257/737 |
| 6,617,655 | B1* | 9/2003 | Estacio et al. ................ 257/401 |
| 6,656,828 | B1 | 12/2003 | Maitani et al. |
| 6,929,976 | B2 | 8/2005 | Chan et al. |
| 6,937,458 | B2 | 8/2005 | Seshan |
| 7,112,884 | B2 | 9/2006 | Bruno |
| 7,161,793 | B2 | 1/2007 | Kurihara et al. |
| 7,227,736 | B2 | 6/2007 | Shioga et al. |
| 1,194,995 | A1 | 12/2007 | McLellan et al. |
| 7,364,998 | B2* | 4/2008 | Chiu et al. .................... 438/597 |
| 7,906,424 | B2 | 3/2011 | Topacio et al. |
| 2002/0070451 | A1* | 6/2002 | Burnette et al. .............. 257/737 |
| 2003/0001287 | A1* | 1/2003 | Sathe ............................ 257/780 |
| 2003/0071300 | A1 | 4/2003 | Yashima et al. |
| 2004/0056351 | A1 | 3/2004 | Wu et al. |
| 2004/0070042 | A1* | 4/2004 | Lee et al. ...................... 257/459 |
| 2004/0104451 | A1 | 6/2004 | Ooi et al. |
| 2004/0188851 | A1 | 9/2004 | Takewaki et al. |
| 2005/0006688 | A1 | 1/2005 | Solo De Zaldivar |
| 2005/0121804 | A1 | 6/2005 | Kuo et al. |
| 2005/0280034 | A1 | 12/2005 | Hosoyamada et al. |
| 2006/0033197 | A1 | 2/2006 | Seshan |
| 2006/0051952 | A1 | 3/2006 | Hsu et al. |
| 2007/0052095 | A1 | 3/2007 | Torii et al. |
| 2007/0069347 | A1 | 3/2007 | Lin et al. |
| 2007/0132095 | A1* | 6/2007 | Marsanne et al. ............ 257/734 |
| 2007/0170587 | A1 | 7/2007 | Honda |
| 2007/0176292 | A1 | 8/2007 | Chen et al. |
| 2008/0146019 | A1 | 6/2008 | Lin et al. |
| 2008/0153204 | A1 | 6/2008 | Jackson et al. |

FOREIGN PATENT DOCUMENTS

| | | |
|---|---|---|
| EP | 0246808 A1 | 11/1987 |
| EP | 0347853 A2 | 12/1989 |
| GB | 1149569 | 4/1969 |
| JP | 5991718 | 6/1984 |
| JP | 61259560 A | 11/1986 |
| JP | 61263251 A | 11/1986 |
| JP | 01084616 A | 3/1989 |
| JP | 6484616 | 3/1989 |
| JP | 01096943 A | 4/1989 |
| JP | 02231755 A | 9/1990 |
| JP | 4268756 | 9/1992 |
| JP | 2700959 | 1/1998 |
| JP | 200031188 | 1/2000 |
| JP | 2006203261 | 8/2006 |
| WO | WO2006050127 A2 | 5/2006 |
| WO | WO2006129832 A1 | 12/2006 |

OTHER PUBLICATIONS

USPTO Notice of Allowance notification date Nov. 8, 2010; U.S. Appl. No. 11/832,486.
USPTO Office Action notification date Mar. 8, 2010; U.S. Appl. No. 11/832,486.
USPTO Office Action notification date Apr. 1, 2010; U.S. Appl. No. 11/949,951.
USPTO Office Action notification date Jul. 12, 2010; U.S. Appl. No. 11/832,486.
USPTO Office Action notification date Aug. 18, 2010; U.S. Appl. No. 11/832,486.
USPTO Office Action notification date Feb. 1, 2011; U.S. Appl. No. 11/949,951.
USPTO Office Action notification date Jul. 8, 2011; U.S. Appl. No. 11/949,951.
USPTO Office Action notification date Nov. 8, 2011; U.S. Appl. No. 12/180,042.
USPTO Notice of Allowance notification date Apr. 4, 2012; U.S. Appl. No. 12/180,042.
USPTO $2^{nd}$ Notice of Allowance notification date Jun. 8, 2012; U.S. Appl. No. 12/180,042.
U.S. Appl. No. 12/180,042, filed Jul. 25, 2008, Roden R. Topacio et al.
Wikipedia; *Benzocyclobutene*; http://en.wikipedia.org/wiki/Benzocyclobutene; Jun. 2007.
Jae-Kyung Wee et al.; *An Antifuse EPROM Circuitry Scheme for Field-Programmable Repair in DRAM*; IEEE Journal of Solid-State Circuits, vol. 35, No. 10, Oct. 2000; pp. 1408-1414.
Tirdad Sowlati et al.; *High Density Capacitance Structures in Submicron CMOS for Low Power RF Applications*; ISLPED '01, Aug. 6-7, 2001; pp. 243-246.
Chi Hou Chan et al.; *Analysis of MMIC Structures Using an Efficient Iterative Approach*; IEEE Transactions on Microwave Theory and Techniques; vol. 36; No. 1; Jan. 1988; pp. 96-105.
Myles H. Wakayama et al.; *A 30-MHz Low-Jitter High-Linearity CMOS Voltage-Controlled Oscillator*; IEEE Journal of Solid-State Circuits; vol. SC-22; No. 6; Dec. 1987; pp. 1074-1081.
T. Ema et al.; *3-Dimensional Stacked Capacitor Cell for 16M and 64M Drams*; 1988 IEEE; pp. 592-595.
Ingo Wolff et al.; *Computer Models for MMIC Capacitors and Inductors*; pp. 853-858, 1988.
Reza Esfandiari et al.; *Design of Interdigitated Capacitors and Their Application to Gallium Arsenide Monolithic Filters*; IEEE Transactions on Microwave Theory and Techniques; vol. 31; No. 1; Jan. 1983; pp. 57-64.
Gary D. Alley; *Interdigital Capacitors and Their Application to Lumped-Element Microwave Integrated Circuits*; IEEE Transactions on Microwave Theory and Techniques; Dec. 1970; pp. 1028-1033.
John L. Hobdell; *Optimization of Interdigital Capacitors*; IEEE Transactions on Microwave Theory and Techniques, vol. MIT-27; No. 9; Sep. 1979; pp. 788-791.
C. Kortekaas; *On-chip Quasi-static Floating-gate Capacitance Measurement Method*; Proc. IEEE 1990 Int. Conference on Microelectric Test Structures; vol. 3; Mar. 1990; pp. 109-113.
PCT/IB2008/002024 International Search Report, 2008.
PCT/IB2008/003343 International Search Report, 2008.
USPTO Office Action mailed Apr. 1, 2010; U.S. Appl. No. 11/949,951.
USPTO Office Action notification date Aug. 18, 2010; U.S. Appl. No. 12/180,042.
USPTO Office Action notification date Jan. 3, 2011; U.S. Appl. No. 12/180,042.

* cited by examiner

CONDUCTOR BUMP METHOD AND APPARATUS

This application is a divisional of prior application Ser. No. 11/832,486, filed Aug. 1, 2007 now U.S. Pat. No. 7,906,424.

BACKGROUND OF THE INVENTION

1. Field of the Invention

This invention relates generally to semiconductor processing, and more particularly to semiconductor die conductor structures and to methods of making the same.

2. Description of the Related Art

Conventional integrated circuits are frequently implemented on a semiconductor substrate or die that consists of a small rectangular piece of semiconductor material, typically silicon, fashioned with two opposing principal sides. The active circuitry for the die is concentrated near one of the two principal sides. The side housing the active circuitry is usually termed the "active circuitry side," while the side opposite the active circuitry side is often referred to as the "bulk silicon side." Depending on the thermal output of the die, it may be desirable to mount a heat transfer device, such as a heat sink, on the bulk silicon side of the die. This mounting may be directly on the bulk silicon side or on a lid that is positioned over the die.

A conventional die is usually mounted on some form of substrate, such as a package substrate or a printed circuit board. Electrical conductivity between the die and the underlying substrate or board is established through a variety of conventional mechanisms. In a so-called flip-chip configuration, the active circuitry side of the die is provided with a plurality of conductor balls or bumps that are designed to establish a metallurgical bond with a corresponding plurality of conductor pads positioned on the substrate or circuit board. The die is flipped over and seated on the underlying substrate with the active circuitry side facing downwards. A subsequent thermal process is performed to establish the requisite metallurgical bond between the bumps and the pads. One of the principal advantages of a flip-chip mounting strategy is the relatively short electrical pathways between the integrated circuit and the substrate. These relatively low inductance pathways yield a high speed performance for the electronic device.

The manner in which the solder balls are electrically connected to the bond pads of the semiconductor die may have a significant impact on the reliability of semiconductor die and the host electronic device to which it is mounted. In one conventional technique, a dielectric passivation layer is fabricated on the active circuitry side of the semiconductor die and lithographically patterned with a plurality of openings corresponding to the locations of the bond pads. Next, a polyimide layer is fabricated over the passivation layer and lithographically patterned with a plurality of openings that are generally concentrically positioned relative to the openings in the passivation layer. A so-called under bump metallization layer is next deposited over the polyimide layer so that metal extends down to and bonds with the underlying bond pads. Thus, the polyimide layer is positioned between the under bump metal layer and the passivation layer. The significance of this arrangement will be explained in further detail below. After the under bump metallization layer is formed, a film or stencil is patterned on the under bump metal layer with a plurality of openings that are positioned over the general locations of the bond pads and a solder material is deposited by a plating or stencil paste process. The stencil is removed and a thermal process is performed to reflow the solder structures. The solder structures solidify into ball-like structures.

Lead-based solders have been widely used in semiconductor device fabrication for decades. More recently, however, chip manufacturers have begun turning to lead-free solders. Lead-free solder materials tend to have relatively lower ductility than lead-based solders. This increased stiffness can lead to significant stresses in the solder balls, particularly where operating temperatures are high or where there is a significant mismatch between the coefficients of thermal expansion between the semiconductor die and the substrate upon which it is mounted. The difficulty with the conventional technique stems from the relative positions of the polyimide layer, the under bump metallization layer and the solder balls. Because the polyimide layer is essentially separated from the solder balls by the under bump metallization layer, the stress reducing abilities of the polyimide layer are not available to the solder balls. Accordingly, high mechanical stresses may be inflicted on the solder balls, particularly at the edges of the solder balls near the interfaces with the under bump metallization layer. The stresses can lead to cracks in the solders balls. If the stresses are acute enough, mechanical failure of the solder balls can occur and produce electrical device failure.

The present invention is directed to overcoming or reducing the effects of one or more of the foregoing disadvantages.

SUMMARY OF THE INVENTION

In accordance with one aspect of the present invention, a method of manufacturing is provided that includes forming a conductor structure on a conductor pad of a semiconductor die. The conductor layer has a surface. A polymeric layer is formed on the surface of the conductor layer while a portion of the surface is left exposed. A solder structure is formed on the exposed portion of the surface and a portion of the polymeric layer.

In accordance with another aspect of the present invention, a method of manufacturing is provided that includes forming a conductor structure on a conductor pad of a semiconductor die. The conductor layer has a surface. A polymeric layer is formed on the surface of the conductor layer while a portion of the surface is left exposed. A solder structure is formed on the exposed portion of the surface and a portion of the polymeric layer. The semiconductor die is coupled to a first substrate.

In accordance with another aspect of the present invention, an apparatus is provided that includes a semiconductor die that has a conductor pad with a surface. A conductor structure is electrically coupled to the conductor pad. A polymeric layer is positioned on the surface of the conductor structure and has an opening to a portion of the surface of the conductor structure. A solder structure is coupled to the portion of the surface of the conductor structure.

In accordance with another aspect of the present invention, an apparatus is provided that includes a semiconductor die coupled to a first substrate. The semiconductor die includes a conductor pad that has a surface. A conductor structure is electrically coupled to the conductor pad. A polymeric layer is positioned on the surface of the conductor structure and has an opening to a portion of the surface of the conductor structure. A solder structure is coupled to the portion of the surface of the conductor structure.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
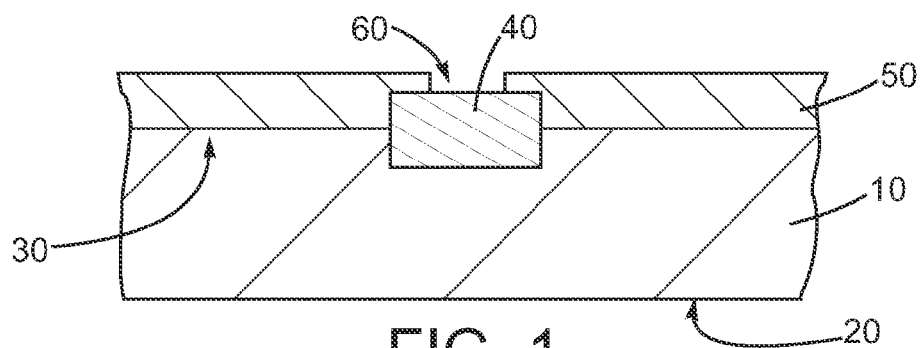
FIG. 1 is a sectional view of a conventional semiconductor die with a bond pad and passivation layer.

In the drawings described below, reference numerals are generally repeated where identical elements appear in more than one figure. Before discussing the exemplary embodiments disclosed herein, it will be instructive to review briefly the structure and manufacture of a conventional solder bump metallization design. Turning now to the drawings, and in particular to FIGS. 1-5, therein is shown an exemplary conventional fabrication process for forming a conductive solder bump on the lower surface of a semiconductor chip 10. For simplicity of illustration, FIGS. 1-5 focus on a relatively small portion of a semiconductor device 10. Turning initially to FIG. 1, the semiconductor device 10 includes two opposing sides 20 and 30. The side 20 is often referred to as a backside and the opposite side 30 is sometimes referred to as a front side. Active chip circuitry (not visible) is typically positioned in one or more layers proximate the front side 30. A bond pad 40 is provided proximate the side 30 and designed to provide an electrical pathway from the circuitry of the device 10 through a later-formed solder bump to establish electrical conductivity with circuitry external to the device 10. There may be scores of such bond pads 40 depending on the complexity of the device 10. A passivation layer 50 of silicon nitride is formed on the side 30 and patterned so that an opening 60 extends to the bond pad 40. The passivation layer 50 is designed to prevent the diffusion of metallic materials down into the semiconductor device 10.

Figure 2:
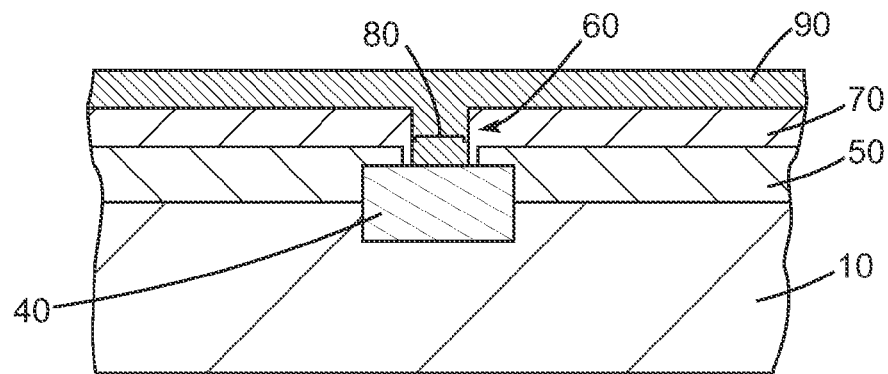
FIG. 2 is a sectional view of a conventional semiconductor die following polyimide and metal layer deposition.

Referring now to FIG. 2, a polyimide layer 70 is formed on the stack consisting of the passivation layer 50, the bond pad 40 and the semiconductor device 10. The polyimide layer 70 is formed with an opening 80 that is concentrically positioned with the opening 60 in the passivation layer 50. Polyimide is chosen for its ability to provide both advantageous structural flexibility and electrical insulation. Following the application of the polyimide layer 70, a metallization layer 90 is formed on the polyimide layer 70 and down through the opening 80 therein to establish ohmic contact with the bond pad 40. The metallization layer 90 is sometimes referred to as an under bump metallization layer or UBM layer. The UBM layer 90 is sometimes deposited as a sequential stack of different metallic materials, such as titanium copper and nickel.

Figure 3:
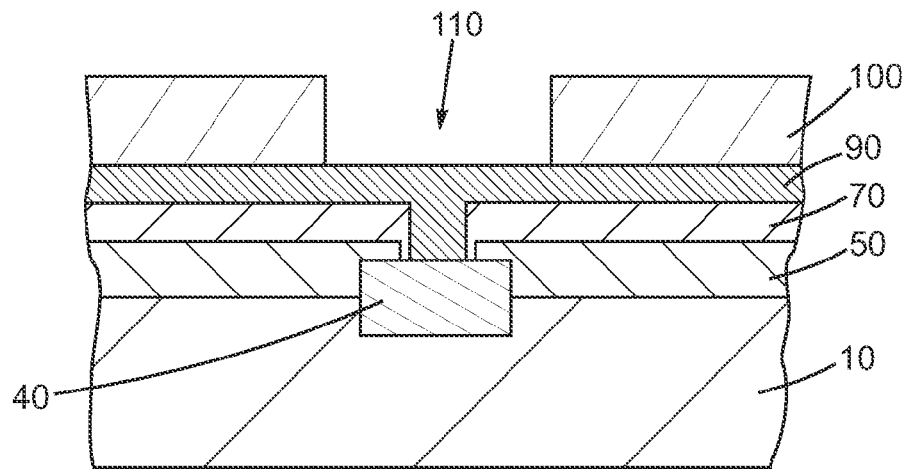
FIG. 3 is a sectional view of a conventional semiconductor die following mask formation.

As shown in FIG. 3, an insulating film 100 is formed on the stack consisting of the metallization layer 90, the polyimide layer 70, the passivation layer 50, the bond pad 40 and the device 10. An opening 110 is patterned in the film 100 that exposes a portion of the metallization layer 90. The film 100 is designed to serve as a mask, or a stencil if a stencil process is used, to enable the subsequent deposition of a conductor material in the opening 110 that will ultimately be fashioned into a solder bump. The opening 110 is typically formed by a lithographic patterning process.

Figure 4:
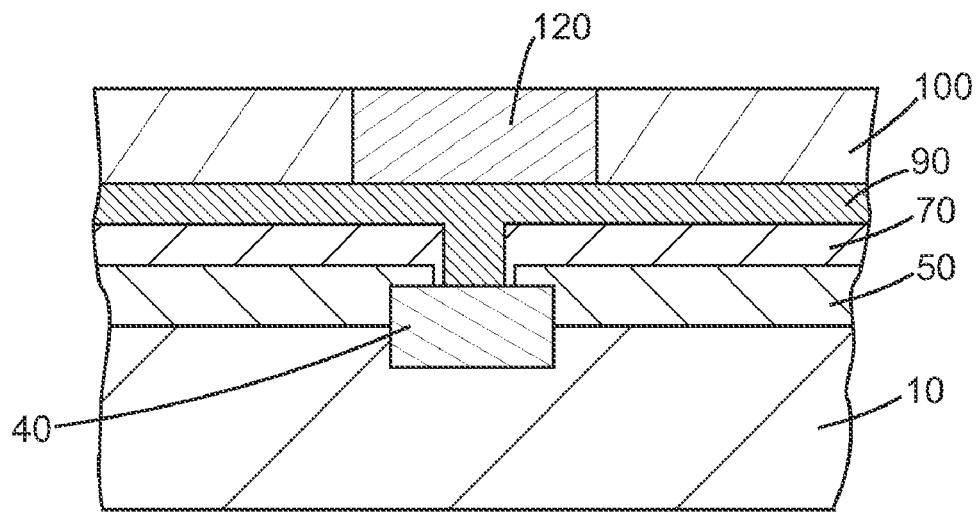
FIG. 4 is a sectional view of a conventional semiconductor die following solder deposition.

Referring now to FIG. 4, the semiconductor device 10 undergoes a plating process so that a conductor material 120 is deposited in the opening 110 of the film 100 and on the exposed portion of the metallization layer 90. The conductor material is typically a solder that establishes ohmic contact with the metallization layer 90. A conventional solder consists of a tin-lead mixture. A more recent innovation involves the use of a lead-free solder, such as a tin-copper solder. The polyimide layer 70 and the passivation layer inhibit diffusion of material from the conductor 120 and the metallization layer 90 into the device 10. The bond pad 40 is unaffected by the plating.

Figure 5:
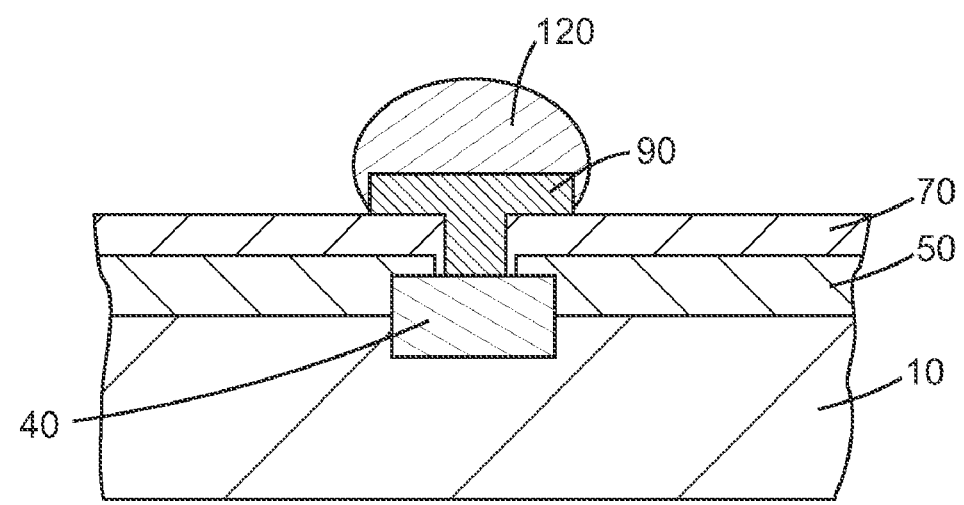
FIG. 5 is a sectional view of a conventional semiconductor die following solder reflow to establish a bump.

The film 100 depicted in FIG. 4 is removed and a thermal reflow process is performed on the semiconductor device 10 as depicted in FIG. 5 to reflow the conductor material 120 into a rounded bump. Following the solder reflow process, portions of the metallization layer 90 lateral to the solder bump 120 are etched away by wet etching. At this point, an ohmic pathway exists between the solder bump 120, the metallization layer 90 and the underlying bump pad 40. The passivation layer 50 and the polyimide layer 70 remain in place.

Figure 6:
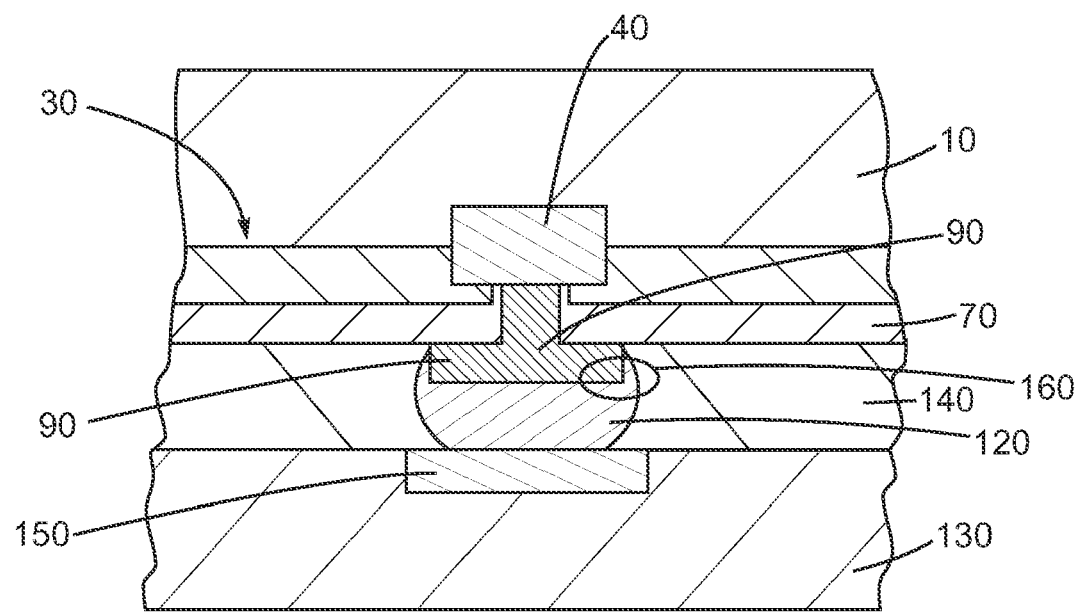
FIG. 6 is a sectional view of a conventional semiconductor die following flip-chip mounting.

As noted in the Background section hereof, the placement of the polyimide layer 70 beneath the metallization layer 90 has an important ramification that is evident when the semiconductor device 10 is flip-chip mounted on another device. In this regard, FIG. 6 depicts a sectional view of the semiconductor device 10 flip-chip mounted on another substrate 130 such that the side 30 faces downward. An underfill material 140 is disposed between the polyimide layer 70 and the substrate 130 to lessen the stresses due to differences in the coefficients of thermal expansion of the electrical device 130 and the semiconductor device 10. The solder bump of the semiconductor device 10 is positioned on a corresponding bond pad 150 of the device 130. In this way, an electrical pathway is established between the bond pad 40 of the device 10 and the bond pad 150 of the device 130 via the metallization layer 90 and the solder bump 120. A small portion of the solder bump 120, the underfill layer 140 and the metallization layer 90 is circumscribed by a small oval 160. The portion circumscribed by the oval 160 is shown at greater magnification in FIG. 7.

Figure 7:
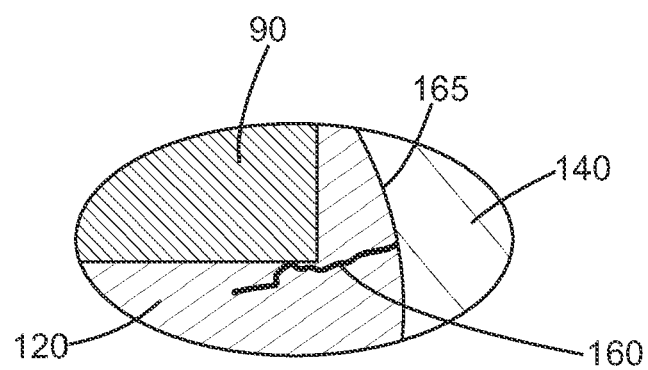
FIG. 7 is a portion of the sectional view of FIG. 6 depicted at greater magnification.
Figure 8:
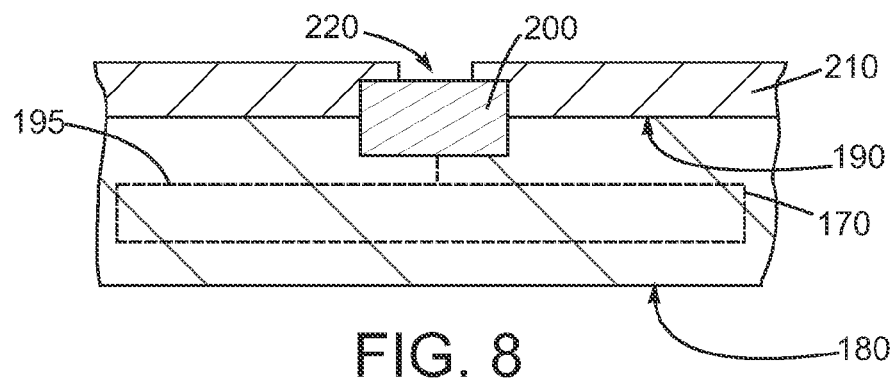
FIG. 8 is a sectional view of an exemplary embodiment of a semiconductor die following passivation layer formation.
Figure 9:
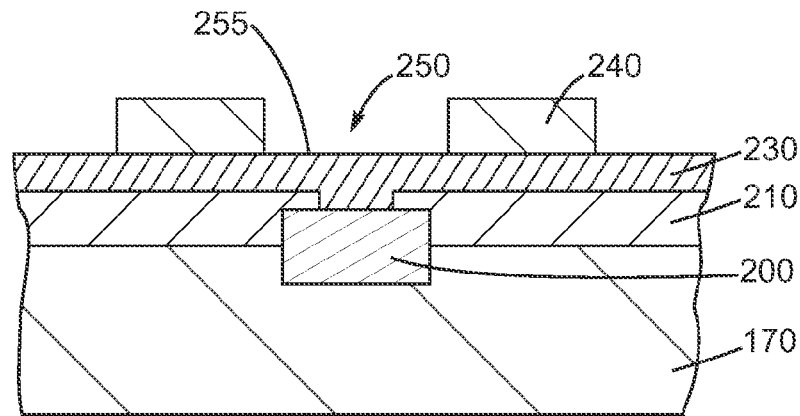
FIG. 9 is a sectional view of the exemplary embodiment of the semiconductor die depicting metal layer and insulating layer formation.

FIG. 7 illustrates a drawback to the placement of the polyimide layer 70 shown in FIG. 6 between the metallization layer 90 and the solder bump 120. A crack 160 is shown in the solder bump 120 that extends from the border 165 with the underfill material 140 toward the central portion of the solder bump 120. The crack 160 is the result of thermal stresses that are not adequately compensated for by virtue of the relative stiffness of the lead-free solder bump 120 and the relative distance of the polyimide layer 70 from the area where the crack 160 forms. The crack 160 may propagate across the entire width of the solder bump 120 and produce an open circuit.

An exemplary novel fabrication process that overcomes the pitfalls of the above-described conventional process may be understood by referring now to FIGS. 8-12, which depict successive sectional views of an integrated circuit or semiconductor device 170 undergoing various process steps leading to the formation of a solder bump. It should be understood that FIGS. 8-12 depict just a small portion of the device 170. The semiconductor device 170 may be any of a myriad of different types of circuit devices used in electronics, such as, for example, microprocessors, graphics processors, application specific integrated circuits, memory devices or the like, and may be single or multi-core.

Structurally speaking, the device 170 has opposing sides 180 and 190. Device circuitry, represented schematically by the dashed box 195, may be located proximate the side 190. To connect the circuitry 195 electrically to external devices, the semiconductor device 170 may be provided with multiple conductor or bond pads, one of which is shown and labeled 200, that are positioned proximate the side 190. Depending on the complexity and size of the semiconductor device 170, there may be scores of the pads 200. The bond pad 200 may be composed of a variety of conductor materials, such as aluminum, copper, silver, gold, titanium, refractory metals, refractory metal compounds, alloys of these or the like. The bond pad 200 may be formed by plating, physical vapor deposition pr other material deposition techniques.

A passivation layer 210 is formed on the side 190 with an opening 220. The passivation layer 210 is designed to inhibit the diffusion of metallic or other materials down into the semiconductor device 170. The layer 210 may be composed of a variety of insulating materials, such as, for example, silicon nitride, silicon dioxide, various silicate glasses or the like. The opening 220 may be formed by well-known lithographic patterning and etching techniques.

For simplicity of illustration, the remaining figures do not include the circuitry 195. Attention is now turned to FIG. 9. A conductor or metal layer 230 is formed on the passivation layer 210 and in the opening 220 thereof so that ohmic contact is established with the bond pad 200. The metallization layer 230 is designed to provide a conducting interface between the bond pad 200 and a subsequently formed solder structure (not shown). The metallization layer 230 may be composed of a variety of conductor materials, such as aluminum, copper, silver, gold, titanium, refractory metals, refractory metal compounds, alloys of these or the like. In lieu of a unitary structure, the layer 230 may consist of a laminate of plural metal layers, such as a titanium layer followed by a nickel-vanadium layer followed by a copper layer. In another embodiment, a titanium layer may be covered with a copper layer followed by a top coating of nickel. However, the skilled artisan will appreciate that a great variety of conducting materials may be used for the metallization layer 230. Various well-known techniques for applying metallic materials may be used, such as physical vapor deposition, chemical vapor deposition, plating or the like. It should be understood that additional conductor structures could be interposed between the metal layer 230 and the conductor pad 200.

An insulating film 240 is deposited on the stack consisting of the metallization layer 230, the passivation layer 210, the pad 200 and the semiconductor device 170. The insulating film 240 is positioned on a surface 255 of the metal layer 230. The layer 240 is intended to provide passivation and cushion against differences in thermal expansion of the semiconductor device 170, the metallization layer 230 and the subsequently formed solder bump (not shown). Exemplary materials for the insulating layer 240 include, for example, polymeric materials such as polyimide and benzocyclobutene or the like, or other insulating materials such as silicon nitride or the like. Spin coating, chemical vapor deposition or other deposition processes may be used. The insulating layer 240 is patterned lithographically with an opening 250 that exposes a portion of the metallization layer 230. Note that the insulating layer 240 is positioned above the metallization layer 230 as opposed to below the metallization layer 90 in the conventional technique depicted in FIGS. 1-5. This placement provides a structural advantage as described in more detail below.

Figure 10:
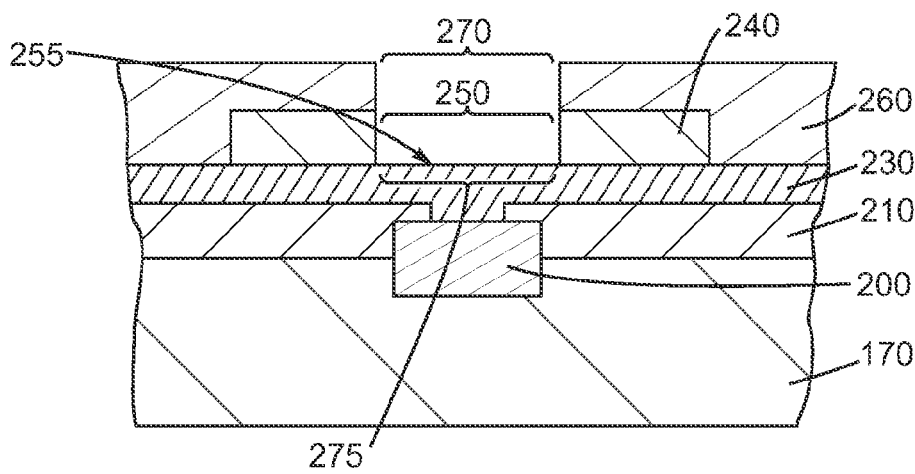
FIG. 10 is a sectional view of the exemplary embodiment of the semiconductor die depicting formation of a mask thereon.

Attention is now turned to FIG. 10. A mask film 260 is deposited on the stack consisting of the insulating layer 240, the metallization layer 230, the passivation layer 210, the pad 200 and the semiconductor device 170. The mask film 260 is patterned lithographically with an opening 270 that is concentric with the opening 250 in the insulating layer 240. Together, the openings 250 and 270 leave a portion 275 of the surface 255 of the metal layer 230 exposed. In a subsequent process, a conductor material is positioned in the combined openings 250 and 270 to establish ohmic contact with the metallization layer 230 and the underlying bond pad 200 of the device 170. The film 260 may be made from, for example, a rubberized epoxy resin with phenol resin, fused silica and synthetic rubber. Optionally, other materials suitable for a metal application mask may be used.

Figure 11:
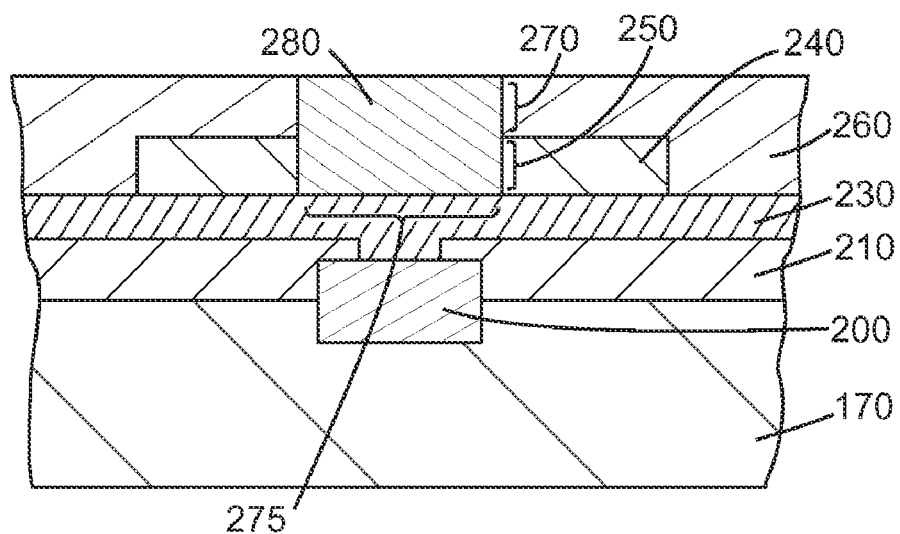
FIG. 11 is a sectional view of the exemplary embodiment of the semiconductor die depicting formation of a conductor structure thereon.

As shown in FIG. 11, the semiconductor device 170 is subjected to a plating process to deposit a conductor material 280 in the openings 250 and 270 and on the exposed portion 275 of the surface 255 of the metallization layer 230. The film 260 serves as a mask against this deposition process. The conductor 280 may be a lead-based solder or lead free as desired. Exemplary materials include, for example, tin-copper, tin-silver, or other solder materials. The conductor material 280 borders the insulating layer 240. At this point, a conductive pathway between the bond pad 200, the metallization layer 230 and the conductor material 280 exists. The passivation layer 210 is unaffected. Of course, another conductor(s) (not shown) may be positioned between the conductor 280 and the bond pad 200 and still provide the desired ohmic pathway.

Figure 12:
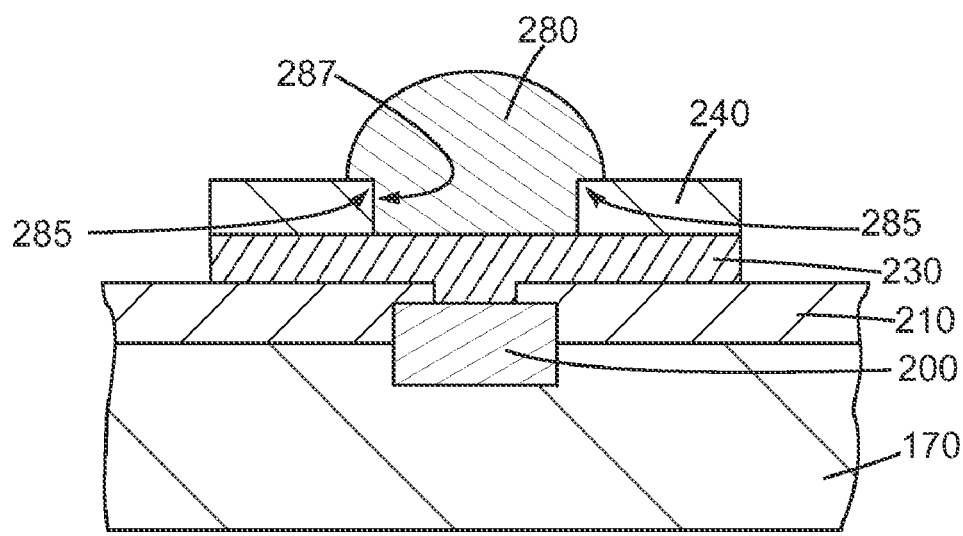
FIG. 12 is a sectional view of the exemplary embodiment of the semiconductor die depicting a reflow of the conductor structure.

As shown in FIG. 12, the film 260 depicted in FIG. 11 is removed and a reflow process is performed to reflow the conductor 280 into a ball or bump-like structure. In an exemplary embodiment, the semiconductor device 170 may be heated to about 170 to 190° C. for about 10 to 120 seconds. The appropriate parameters for the reflow will depend on the composition of conductor material 280. Unwanted portions of the metallization layer 230 are removed by a chemical etch process. Thus, portions of the passivation layer 210 lateral to the conductor 280 are exposed. A conductive pathway exists between the conductor 280 and the bump bond pad 200 by way of the metallization layer 230. Note that the conductor 280 is positioned on a portion 285 of the insulating layer 240. The portion 285 provides a stress reducing interface with a peripheral corner 287 of the conductor 280.

Figure 13:
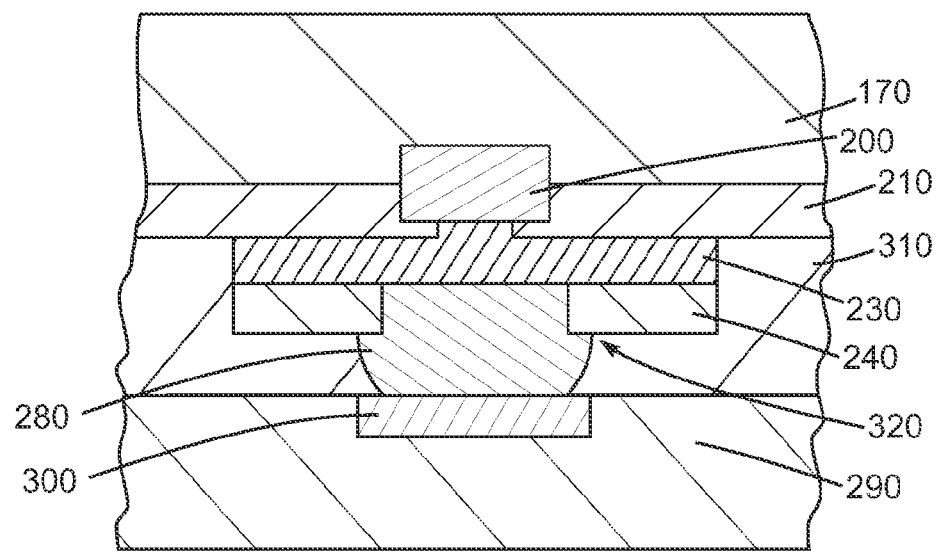
FIG. 13 is a sectional view of the exemplary embodiment of the semiconductor die depicting an exemplary mounting to a substrate.

The advantages of the new positioning of the insulating layer 240 are evident when the device 170 is mounted to another substrate. Attention is now turned to FIG. 13, which depicts the semiconductor device 170 mounted on another electrical device 290. The electrical device 290 may be a printed circuit board, or other electrical device as desire. FIG. 13 depicts a flip-chip mounting arrangement in which the device 170 is flipped over and mounted on the electrical device 290 so that the solder structure 280 is seated on a bond pad 300 of the electrical device 290. It should be understood that the device 290 may include scores of such pads 300 to receive corresponding bumps 280 of the device 170. If desired, the pads 300 may be fitted with small solder bumps (not shown) designed to meld with solder structure(s) 280 during a subsequent reflow. An underfill material 310 is dispersed between the device 170 and the electrical device 290 to reduce the effects of differences in the coefficients of thermal expansion of the device 170 and the device 290. The underfill 310 may be, for example, an epoxy resin mixed with silica fillers and phenol resins. Because the insulating layer 240 is positioned between the metallization layer 230 and the solder structure 280, an additional compliant cushioning effect is provided for the corner 320 of the solder bump 280 against the types of thermal stresses and cracking associated with the conventional structure depicted in FIGS. 6 and 7. Note that the corner 320 extends around the entire periphery of the solder structure 280.

Figure 14:
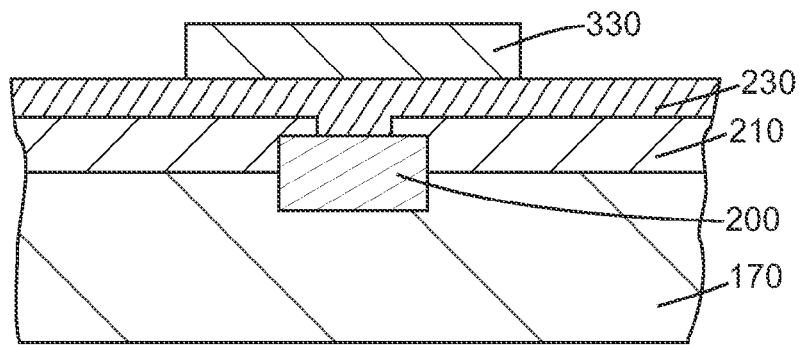
FIG. 14 is a sectional view of an alternate exemplary embodiment of a semiconductor die depicting passivation, metal layer and mask formation thereon.
Figure 15:
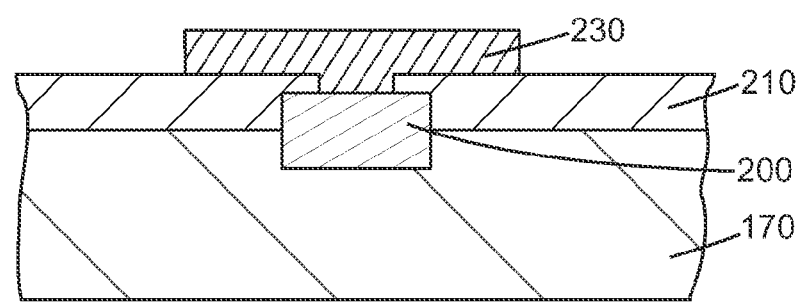
FIG. 15 is a sectional view of the alternate exemplary embodiment of the semiconductor die depicting removal of the mask and portions of the metal layer.

In the foregoing illustrative embodiment, a plating process may be used to form the solder structures 280. In an alternate exemplary process depicted in FIGS. 14-18, a stencil process may be used to establish a solder structure. Turning initially to FIG. 14, the semiconductor device 170 may be processed as described elsewhere herein to provide the bond pad 200, the passivation layer 210 and the metallization layer 230. At this stage, an etch mask 330 of resist or other mask material is formed on the metallization layer 230, and an etch is performed on the metallization layer 230 to trim portions thereof lateral to the bond pad 200 and expose portions of the passivation layer 210 as shown in FIG. 15. The etch mask 330 may be removed by ashing, solvent stripping or the like. When viewed from above, the metallization layer 230 may be circular or another shape as desired. The bond pad 200 is unaffected by the etch or mask strip.

Figure 16:
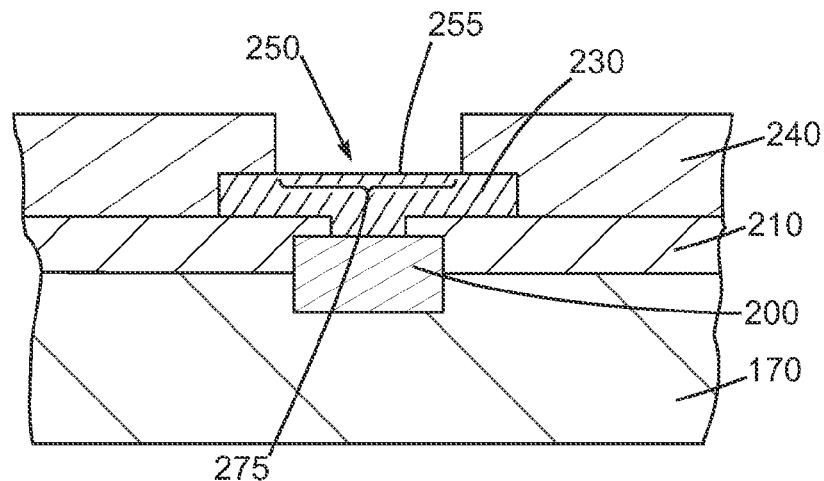
FIG. 16 is a sectional view of the alternate exemplary embodiment of the semiconductor die depicting formation of an insulating layer thereon.

As shown in FIG. 16, the insulating layer 240 is formed on the stack consisting of the metallization layer 230, the passivation layer 210, the bond pad 200 and the semiconductor device 170 as generally described elsewhere herein. The insulating layer 240 has the aforementioned opening 250 leading to the metallization layer 230 and leaving the surface thereof 255 with an exposed portion 275.

Figure 17:
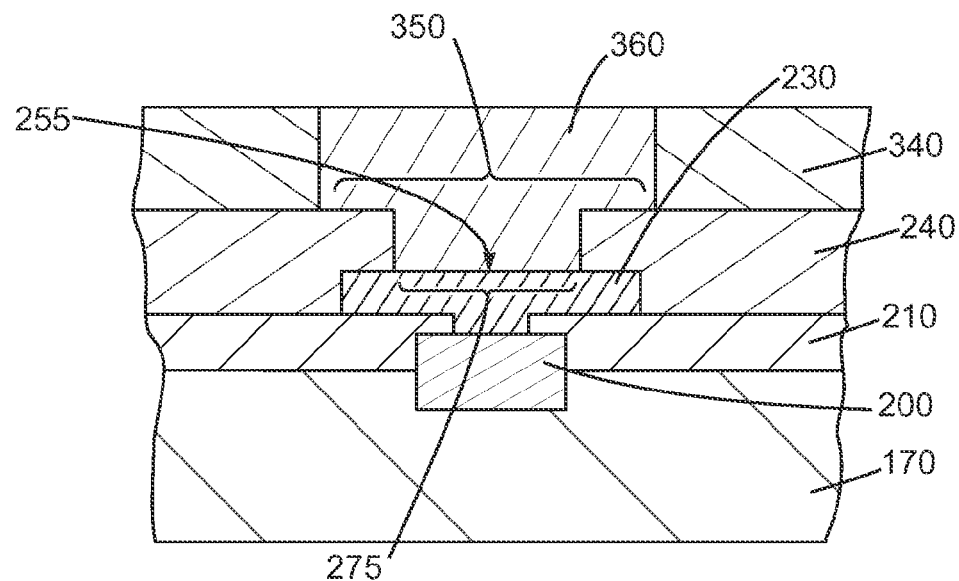
FIG. 17 is a sectional view of the alternate exemplary embodiment of the semiconductor die depicting formation of a conductor structure thereon.

Referring now to FIG. 17, a stencil 340 is formed on the stack consisting of the insulating layer 240, the metallization layer 230, the passivation layer 210, the bond pad 200 and the semiconductor device 170. The stencil 340 includes an opening 350 over the metallization layer 230 and portions of the insulating layer 240. The stencil 340 may be fabricated from, for example, a rubberized epoxy resin with phenol resin, fused silica and synthetic rubber. Optionally, other materials suitable for metal application stencils may be used. A conductor paste 360 is pressed into the opening 350 of the stencil 340. The conductor paste 360 is positioned on the exposed portion 275 of the surface 255 of the metal layer 230 and a portion 365 of the insulating layer 240. The paste 360 may be composed of the same materials used for the solder bump 280 described elsewhere herein. Of course, another conductor(s) (not shown) may be positioned between the conductor 360 and the bond pad 200 and still provide the desired ohmic pathway.

Figure 18:
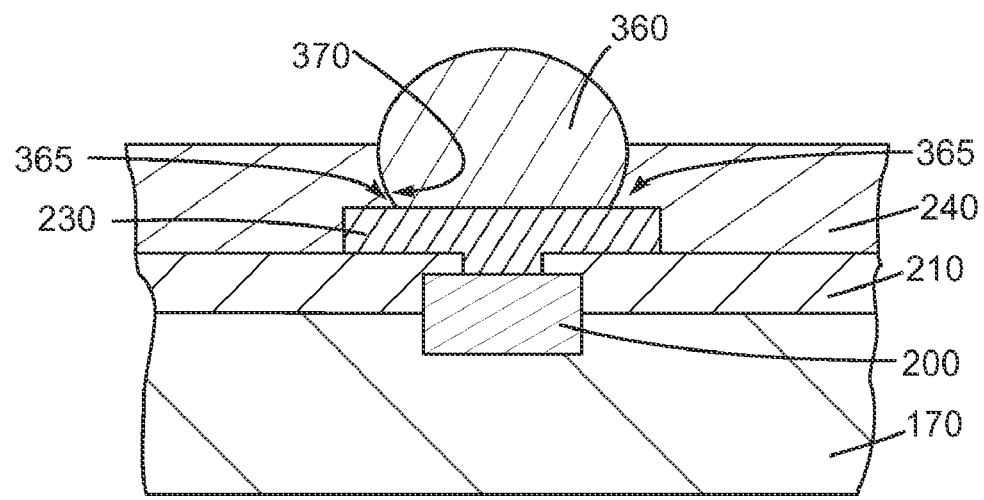
FIG. 18 is a sectional view of the alternate exemplary embodiment of the semiconductor die depicting a reflow of the conductor structure.

To complete the process, the stencil 340 is removed and a thermal reflow process is performed to reshape the conductor paste 360 into a bump that metallurgically bonds to the pad 200 as shown in FIG. 18. In an exemplary embodiment, the semiconductor device 170 may be heated to about 170 to 190° C. for about 10 to 120 seconds. The appropriate parameters for the reflow will depend on the composition of conductor paste 360. The passivation layer 210 is unaffected. The conductor 360 is positioned on a portion 365 of the insulating layer 240. As in the above-described embodiment, the insulating layer 240 provides enhanced structural protection for a peripheral corner 370 of the solder bump 360.

Figure 19:
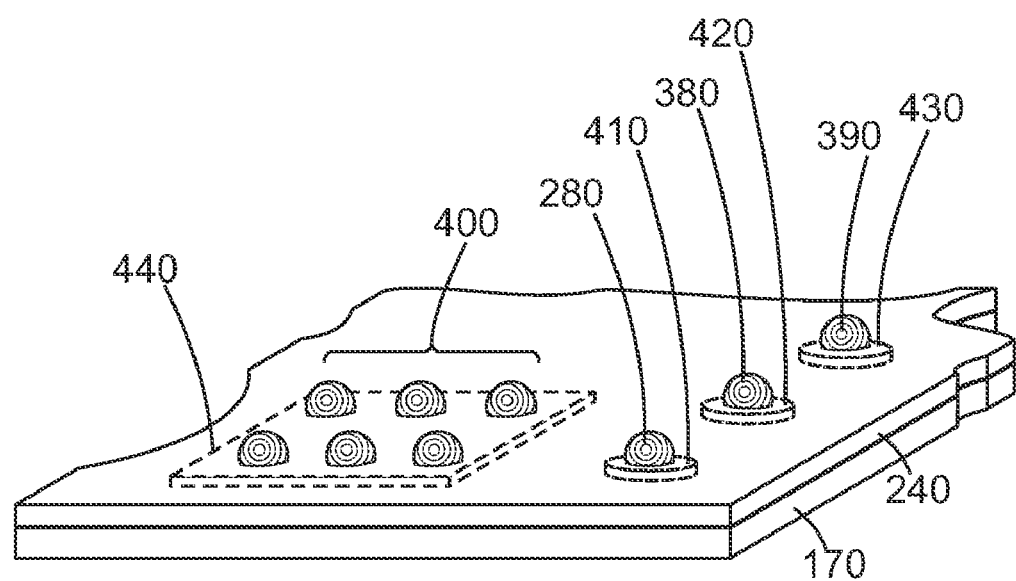
FIG. 19 is a pictorial view of another alternate exemplary embodiment of a semiconductor die provided with plural bump structures and a common metal layer.

In addition to providing improved structural protection for the solder bumps 280, 360 etc., the positioning of the insulating layer 240 as disclosed herein enables the under bump metallization layer 230 to serve as an electrical routing structure. An exemplary embodiment may be understood by referring now to FIG. 19, which is a pictorial view of a portion of the semiconductor device 170 positioned with the insulating layer 240 and several bumps facing upwardly. One of the bumps is labeled 280 as in FIGS. 8-12. Two other bumps are separately labeled 380 and 390. A group of six bumps are collectively labeled 400. The bumps 280, 380 and 390 may be formed and provided with discrete under bump conductor structures or metal layers 410, 420 and 430 that are structurally isolated using the techniques disclosed herein. The metal layers 410, 420 and 430 are covered by the insulating layer 240 and thus shown in phantom. However, the group of bumps 400 may be formed using the techniques disclosed herein, but with a common under bump conductor structure or metal layer 440 that is covered by the insulating layer 240 and thus also shown in phantom. The insulating layer 240 is thus formed with plural openings to expose plural portions of the metal layer 440 prior to formation of the bumps 400. In this way, the metal layer 440 can serve as a routing structure for the group of bumps 400. This may be advantageous where several bumps are dedicated temporarily or permanently to one type of input/output, such as power or ground. Because the insulating layer 240 is positioned between the group 400 of bumps and the metallization layer 440, selected bumps can be tied together without risk that solder will seep laterally and make unwanted shorts during reflow. Of course, the number and groupings of bumps and shaping of the common under bump metallization layer(s) 440 are subject to great variation.

The skilled artisan will appreciate that the exemplary processes disclosed herein may be performed concurrently on multiple dice that are arranged in a wafer. Thereafter, singulation may be performed. Optionally, an individual die may be processed after singulation.

Figure 20:
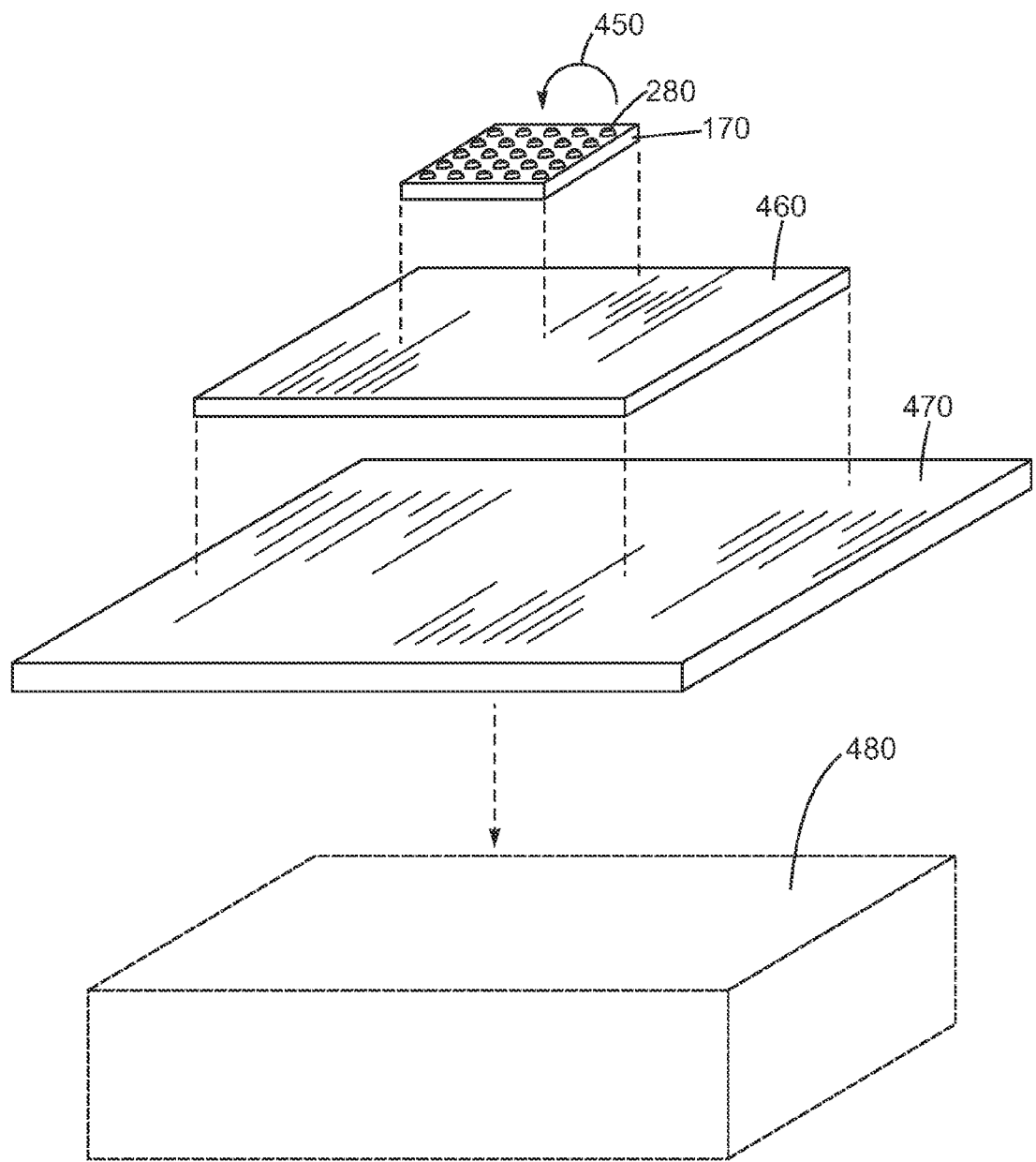
FIG. 20 is an exploded pictorial view of an exemplary semiconductor die depicting exemplary mounting configurations.

The semiconductor device 170 may be mounted in a variety of ways. FIG. 20 depicts an exploded pictorial view of a few exemplary mounting possibilities. The semiconductor device 170 is depicted with the solder bumps 280 facing upwards. The device 170 may be flipped over as indicated by the arrow 450 and flip-chip mounted on a substrate 460. The substrate 460 may be a package substrate, a printed circuit board or other type of substrate. If configured as a package substrate, the substrate 460 may be a pin grid array, a ball grid array, a land grid array, a surface mount or other type configuration. The substrate 460 may be mounted to another substrate 470. The substrate 470 may be a printed circuit board or other type of substrate. For example, the substrate 470 may be a motherboard for a computer system. The semiconductor device 170 may be included in a larger system, such as a computing device represented by the dashed box 480. The computing device 480 may be include, for example, a digital television, a handheld mobile device, a personal computer, a server, a memory device, an add-in board such as a graphics card, or any other computing device employing semiconductors.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. An apparatus, comprising:
a semiconductor die including a conductor pad;
a conductor structure electrically coupled to the conductor pad and having a surface;
a polymeric layer positioned on the surface of the conductor structure and having plural openings to plural portions of the surface of the conductor structure; and
a solder structure coupled to each of the plural portions of the surface of the conductor structure, a portion of each of the solder structures being position on the polymeric layer, at least one of the plural openings being positioned over the conductor pad.

2. The apparatus of claim 1, wherein the polymeric layer comprises a polyimide layer.

3. The apparatus of claim 1, wherein the solder structures comprises a lead-free solder.

4. The apparatus of claim 1, wherein the conductor structure comprises a laminate of plural metal layers.

5. The apparatus of claim 1, wherein the polymeric layer includes another opening to another portion of the surface of the conductor structure and another solder structure is coupled to the another portion of the surface of the conductor structure.

6. An apparatus, comprising:
a semiconductor die coupled to a first substrate and including a conductor pad;
a conductor structure electrically coupled to the conductor pad and having a surface;
a polymeric layer positioned on the surface of the conductor structure and having plural openings to plural portions of the surface of the conductor structure; and
a solder structure coupled to each of the plural portions of the surface of the conductor structure, a portion of each of the solder structures being position on the polymeric layer, at least one of the plural openings being positioned over the conductor pad.

7. The apparatus of claim 6, wherein the first substrate comprises a package substrate.

8. The apparatus of claim 6, wherein the first substrate is coupled to second substrate.

9. The apparatus of claim 6, wherein the polymeric layer comprises a polyimide layer.

10. The apparatus of claim 6, wherein the solder structures comprise a lead-free solder.

11. The apparatus of claim 6, wherein the conductor structure comprises a laminate of plural metal layers.

12. An apparatus, comprising:
a semiconductor die including a first conductor pad and a second conductor pad laterally separated from the first conductor pad;
a first conductor structure electrically coupled to the first conductor pad and having a first surface, and a second conductor structure electrically coupled to the second conductor pad and having a second surface;
a first polymeric layer positioned on the first surface of the first conductor structure and
having a first opening to the first surface and a second opening to the first surface of the first conductive structure
a second polymeric layer positioned on the second surface of the second conductor structure and having a third opening to the second surface of the second conductor structure; and
whereby the first and second polymeric layers are not contiguous.

13. The apparatus of claim 12, comprising at least two solder structures coupled to the first surfaces of the first conductor structure and a solder structure coupled to the second surface of the second conductor structure, a portion of each of the at least two solder structures being positioned on the first polymeric layer and a portion of the solder structure coupled to the second surface of the second conductor structure being positioned on the second polymeric layer.

14. The apparatus of claim 12, wherein the first and second polymeric layers comprise polyimide.

15. The apparatus of claim 12, wherein the at least two solder structures and the solder structure coupled to the second surface of the second conductor structure comprise a lead-free solder.

* * * * *